US012620502B2

(12) United States Patent
Chen et al.

(10) Patent No.: US 12,620,502 B2
(45) Date of Patent: May 5, 2026

(54) NUCLEAR REACTOR COMPRISING A REACTOR VESSEL CONTAINING A REACTOR CORE AND AN ALKALI METAL THERMOELECTRIC CONVERTER

(71) Applicant: SHANGHAI NUCLEAR ENGINEERING RESEARCH & DESIGN INSTITUTE CO., LTD., Shanghai (CN)

(72) Inventors: Qichang Chen, Shanghai (CN); Cheng Ye, Shanghai (CN); Chuntao Tang, Shanghai (CN); Xujia Wang, Shanghai (CN); Qian Lin, Shanghai (CN); Jinkun Zhao, Shanghai (CN); Weizhong Zhang, Shanghai (CN); Chuntian Yuan, Shanghai (CN); Yalan Qian, Shanghai (CN); Jinming Li, Shanghai (CN); Wei Wang, Shanghai (CN)

(73) Assignee: SHANGHAI NUCLEAR ENGINEERING RESEARCH & DESIGN INSTITUTE CO., LTD., Shanghai (CN)

( * ) Notice: Subject to any disclaimer, the term of this patent is extended or adjusted under 35 U.S.C. 154(b) by 404 days.

(21) Appl. No.: 18/256,232

(22) PCT Filed: Dec. 7, 2021

(86) PCT No.: PCT/CN2021/135991
§ 371 (c)(1),
(2) Date: Jun. 7, 2023

(87) PCT Pub. No.: WO2022/121878
PCT Pub. Date: Jun. 16, 2022

(65) Prior Publication Data
US 2024/0021334 A1 Jan. 18, 2024

(30) Foreign Application Priority Data
Dec. 8, 2020 (CN) .......................... 202011422901.1

(51) Int. Cl.
*G21D 7/04* (2006.01)
*H10N 10/854* (2023.01)
(Continued)

(52) U.S. Cl.
CPC ............. *G21D 7/04* (2013.01); *H10N 10/854* (2023.02); *G21C 1/326* (2013.01); *G21C 15/257* (2013.01)

(58) Field of Classification Search
CPC ...... G21D 7/04; H10N 10/854; G21C 15/257; G21C 1/326; G21C 3/047
(Continued)

(56) References Cited

U.S. PATENT DOCUMENTS 3,189,765 A * 6/1965 Danko .................... G21D 7/04
376/321
3,430,079 A * 2/1969 Danko .................... G21D 7/04
376/321
(Continued)

FOREIGN PATENT DOCUMENTS

CN 102568623 A 7/2012
CN 202772811 U 3/2013
(Continued)

OTHER PUBLICATIONS

International Search Report for corresponding International Application No. PCT/CN2021/135991 mailed Mar. 1, 2022.
Written Opinion for corresponding International Application No. PCT/CN2021/135991 dated Mar. 1, 2022.
First Office Action dated Nov. 12, 2021 for corresponding Chinese Application No. 202011422901.1 and English translation.

*Primary Examiner* — Jack W Keith
*Assistant Examiner* — Daniel Wasil
(74) *Attorney, Agent, or Firm* — Chrisman Gallo Tochtrop LLC

(57) ABSTRACT
A nuclear reactor includes a reactor vessel containing an alkali metal thermoelectric converter. The bottom part of the vessel contains liquid alkali metal. A reactor core is arranged in the vessel and includes fuel rods. The surface of each fuel rod is provided with a first liquid absorption core. The bottom part of the reactor core is provided with second liquid absorption cores which are connected to the first
(Continued)

liquid absorption cores. The cores are together configured to use capillary action to pump liquid alkali metal to an upper portion of an outer surface of the fuel rods, where the liquid alkali metal is vaporized into alkali metal vapor. The converter divides the inside of the reactor vessel into a high-pressure vapor chamber and a low-pressure vapor chamber. The converter is configured to receive alkali metal vapor from the high-pressure vapor chamber for use in electric power generation.

7 Claims, 3 Drawing Sheets

(51) Int. Cl.
　　 *G21C 1/32* 　　　 (2006.01)
　　 *G21C 15/257* 　　 (2006.01)
(58) Field of Classification Search
　　 USPC ................................................. 376/321, 367
　　 See application file for complete search history.

(56) References Cited

U.S. PATENT DOCUMENTS

| | | |
|---|---|---|
| 2007/0017565 A1 | 1/2007 | Nakagiri et al. |
| 2015/0049850 A1 | 2/2015 | Hattori et al. |

FOREIGN PATENT DOCUMENTS

| | | |
|---|---|---|
| CN | 109119174 A | 1/2019 |
| CN | 209216594 U | 8/2019 |
| CN | 111128412 A | 5/2020 |
| CN | 111600512 A | 8/2020 |
| CN | 112865606 A | 5/2021 |
| CN | 113593734 A | 11/2021 |
| JP | H05-191989 A | 7/1993 |
| JP | H10-132994 A | 5/1998 |
| JP | 2018-179886 A | 11/2018 |

* cited by examiner

NUCLEAR REACTOR COMPRISING A REACTOR VESSEL CONTAINING A REACTOR CORE AND AN ALKALI METAL THERMOELECTRIC CONVERTER

CROSS-REFERENCE TO RELATED APPLICATIONS

This application is a national stage entry of International Application No. PCT/CN2021/135991 filed on Dec. 7, 2021, which claims the benefit of priority to Chinese Application No. 202011422901.1, filed Dec. 8, 2020, the entire disclosures of which are hereby incorporated herein by reference.

TECHNICAL FIELD

The present application relates to the technical field of nuclear reactor power generation, and more particularly to an alkali metal reactor power supply.

BACKGROUND

A microreactor is a unique small reactor system, typically with thermal power of less than 20 MW and electrical power of less than 10 MW, and it is mainly used to meet the electric power or power requirements of special application scenarios such as astrospace, ocean, and land bases etc. Compared with traditional reactors, microreactors are significantly reduced in terms of power, size, and weight, and have features mainly including: factory prefabrication, devices being transportable, and self-adjusting operation. A microreactor greatly simplifies system design and can realize rapid installation and deployment in different application environments, so that it can be widely applied for energy security in various remote areas. At present, specific applications of microreactors include astrospace reactor power supplies, deep-sea nuclear power supplies, vehicle-mounted reactor power supplies, and the like.

Alkali metal thermoelectric conversion (AMTEC) is a high-efficiency static thermoelectric conversion technology, which uses gaseous or liquid alkali metals (lithium, sodium, potassium, etc.) as working mediums, and uses the $\beta''$-$Al_2O_3$ solid electrolyte (BASE) as a selective ion permeable membrane. Migration process of alkali metal ions in the BASE realizes the conversion of heat energy to electrical energy, theoretically, the thermoelectric conversion efficiency can reach more than 30%. The AMTEC is a closed loop system filled with alkali metal, the system is divided by the BASE into two parts with different pressures, wherein the alkali metal on the high-pressure side absorbs heat through a heat source, and the alkali metal vapor on the low-pressure side condenses into a liquid state through a condenser and then returns to the high-pressure side through an electromagnetic pump or a liquid-absorption core. Due to the combination of characteristics of being static and having high thermoelectric conversion efficiency, the alkali metal thermoelectric conversion technology can be applied to various fields such as nuclear energy, and has application potential in outer space and remote areas.

SUMMARY

The present application provides an alkali metal reactor power supply, which can directly convert heat generated by a reactor into electric power through an alkali metal thermoelectric converter, and provide electric power guarantee for remote areas, underwater submersible devices, space-crafts and the like.

The alkali metal reactor power supply of the present application includes: a reactor vessel, the bottom of which is provided with liquid alkali metal; a reactor core, which is arranged in the reactor vessel and includes a plurality of fuel rods and a radial reflective layer arranged at the periphery of the plurality of fuel rods, wherein a surface of the fuel rod is provided with first liquid-absorption cores, and the bottom of the reactor core is provided with second liquid-absorption cores arranged to cover the bottom of the reactor core, to connect to the first liquid-absorption core, and to contact with the liquid alkali metal; and an alkali metal thermoelectric converter, which is arranged, along a circumferential direction of the radial reflective layer, between the outside of the radial reflective layer and the inner wall of the reactor vessel, and which divides inside of the reactor vessel into a high-pressure vapor chamber located above the alkali metal thermoelectric converter and a low-pressure vapor chamber located below the alkali metal thermoelectric converter.

Preferably, a condenser is arranged in the low-pressure vapor chamber.

Preferably, the alkali metal thermoelectric converter includes an anode, a cathode, and a BASE tube arranged between the anode and the cathode, and alkali metal vapor in the high-pressure vapor chamber passes through the anode, the BASE tube and the cathode in sequence, so as to generate a potential difference between the anode and the cathode.

Preferably, the reactor vessel is vacuumized before the reactor is activated, so that the inside of the reactor vessel is in a negative pressure state.

Preferably, the fuel rod includes a fuel pellet and a cladding covering the fuel pellet, and the first liquid-absorption cores are arranged on an outer surface of the cladding, groove being provided on the outer surface of the cladding.

Preferably, a control rod is arranged in the middle of the reactor core for controlling the reactor.

Preferably, several control drums are arranged in the radial reflective layer for power controlling of the reactor.

In the alkali metal reactor power supply of the present application, the effects of capillary force of the first liquid-absorption cores and the second liquid-absorption cores are utilized to pump the liquid alkali metal to the surface of the fuel rod, and the heat generated by the nuclear fuel fission of the fuel rod is used for vaporization of the liquid alkali metal. The alkali metal vapor enters the high-pressure vapor chamber, enters the alkali metal thermoelectric converter for power generation due to the high pressure, and then enters the low-pressure vapor chamber, where the alkali metal vapor condenses into a liquid state, so as to realize the circulating power of the liquid alkali metal without using pumps, valves and other components in traditional reactor systems, thus greatly improving the reliability. The present application has a simplified system and a simple structure, wherein the reactor and thermoelectric converter are integrated, and the same working medium and the same circulating system are used to directly generate electricity. The alkali metal reactor power supply device of the present application has the characteristics of small size, light weight, flexible arrangement, high power generation efficiency, etc., and can be transported, installed and deployed as a whole.

BRIEF DESCRIPTION OF THE DRAWINGS

In order to more clearly illustrate the technical solutions of the embodiments of the present application, the figures that need to be used in the embodiments of the present application will be briefly introduced as follows. Obviously, the figures described below are only some examples of the present application. Those of ordinary skill in the art can further obtain other figures based on the figures without paying creative efforts.

In the figures, the figures are not drawn to scale.

REFERENCE NUMBERS

1—Reactor vessel, 2—Liquid alkali metal, 3—Fuel rod, 4—Reactor core, 5—First liquid-absorption core, 6—High-pressure vapor chamber, 7—Alkali metal thermoelectric converter, 8—Low-pressure vapor chamber, 9—Condenser, 10—Control rod, 11—Radial reflective layer, 12—Control drum, 13—Groove, 14—Cladding, 15—Fuel pellet, 16—BASE tube, 17—Cathode, 18—Anode, 19—Second liquid-absorption core.

DETAILED DESCRIPTION

The implementation manner of the present application will be further described in detail below with reference to the figures and embodiments. The detailed description and figures of the following embodiments are used to illustrate the principles of the present application, but not to limit the scope of the present application, that is, the present application is not limited to the described embodiments.

In the description of this application, it should be noted that unless otherwise specified, the meaning of "a plurality of" is two or more; the orientation or positional relationship indicated by the terms "upper", "lower", "left", "right", "inner", "outside" and so on are only for the convenience of describing the present application and simplifying the description, rather than indicating or implying that the referred device or element must have a specific orientation, be constructed and operated in a specific orientation, and therefore cannot be understood as restrictions to this application.

The orientation terms appearing in the following description are the directions shown in the figures, and do not limit the specific structure of the present application. In the description of this application, it should also be noted that unless otherwise specified and limited, the terms "connected with" and "connected to" should be understood in a broad sense, for example, it can be a fixed connection or a detachable connection, or an integrative connection; it can be either a direct connection or an indirect connection through an intermediary. For those of ordinary skill in the art, the specific meanings of the above terms in this application can be understood according to specific situations.

Figure 1:
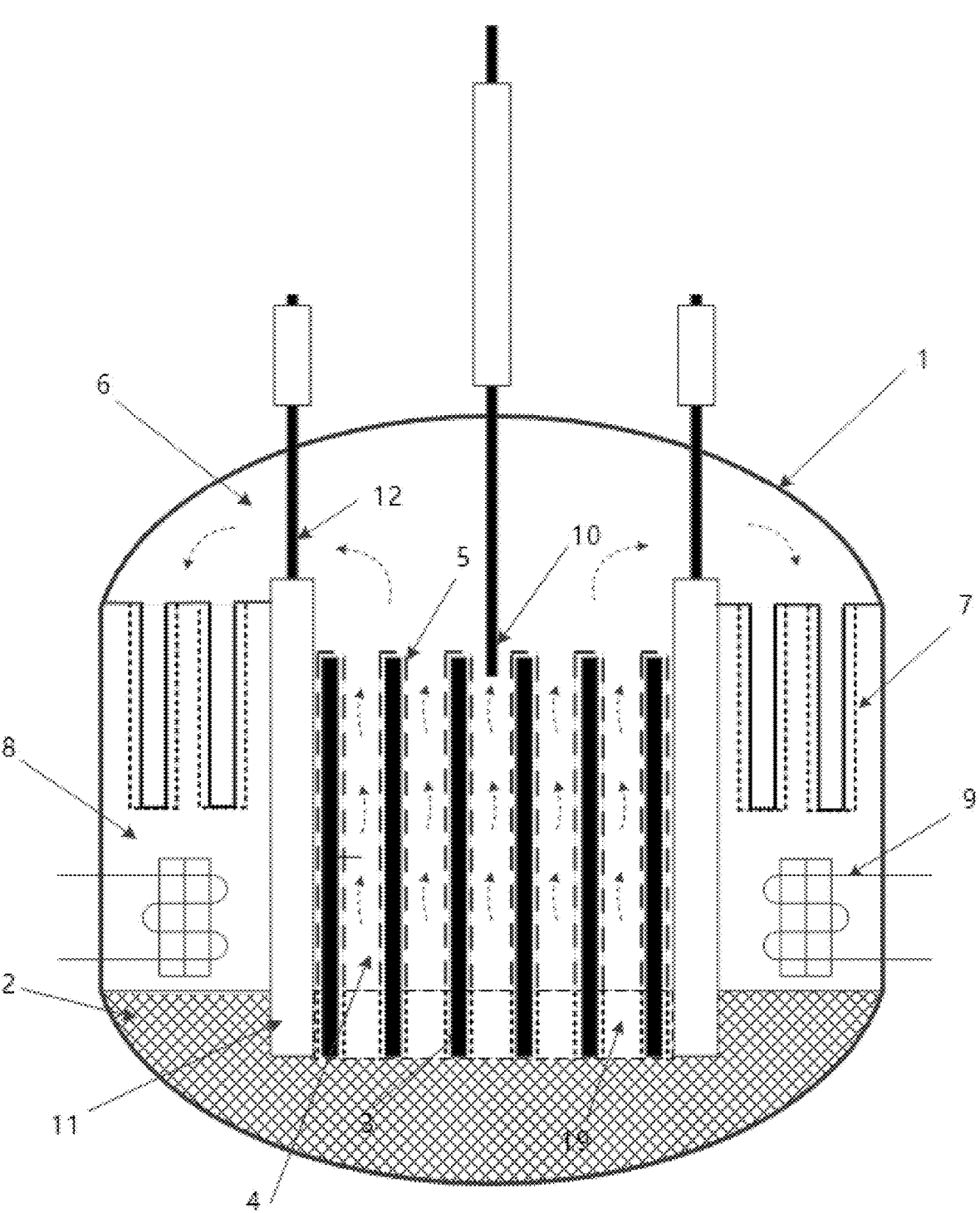
FIG. 1 is a schematic diagram of an alkali metal reactor power supply according to the present application.
Figure 2:
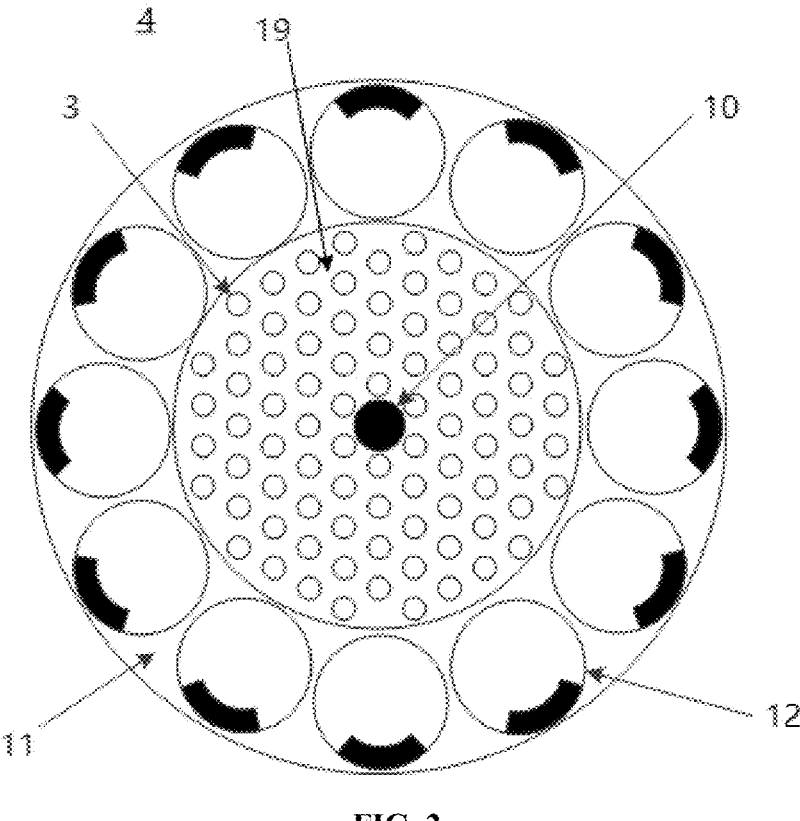
FIG. 2 is a schematic top diagram of the reactor core in FIG. 1.

FIG. 1 is a schematic diagram of an alkali metal reactor power supply according to the present application, and FIG. 2 is a schematic top diagram of the reactor core 4 in FIG. 1.

As shown in FIGS. 1 and 2, the alkali metal reactor power supply of the present application includes a reactor vessel 1, a reactor core 4 and an alkali metal thermoelectric converter 7. The bottom of the reactor vessel 1 is provided with liquid alkali metal 2, and the reactor core 4 is arranged in the reactor vessel 1. Specifically, the reactor core 4 may be arranged in the middle part of the reactor vessel 1. The reactor core 4 includes a plurality of fuel rods 3 and a radial reflective layer 11 arranged on the periphery of the plurality of fuel rod 3. A surface of the fuel rod 3 is provided with first liquid-absorption cores 5, while the bottom of the reactor core 4 is provided with second liquid-absorption cores 19, and the second liquid-absorption cores 19 cover the bottom of the reactor core 4, are connected with the first liquid-absorption cores 5, and can contact with the liquid alkali metal 2. An alkali metal thermoelectric converter 7 is arranged, along a circumferential direction of the radial reflective layer 11, between the outside of the radial reflective layer 11 and the inner wall of the reactor vessel 1, and divides the reactor vessel 1 into a high-pressure vapor chamber 6 located above the alkali metal thermoelectric converter 7 and a low-pressure vapor chamber 8 located below the alkali metal thermoelectric converter 7.

The reactor vessel 1 has a closed pressure-bearing structure. Before the reactor is activated, the reactor vessel 1 is vacuumized, so that the inside of the reactor vessel is in a negative pressure state, that is, a pressure in the reactor vessel 1 is lower than atmospheric pressure, which is conducive to the vaporization of the liquid alkali metal 2.

The second liquid-absorption cores 19 at the bottom of the reactor core 4 cover the bottom of the reactor core 4. The second liquid-absorption cores 19 can cover all the pores among the bottoms of the fuel rods 3, and are connected with the first liquid-absorption cores 5. The second liquid-absorption cores 19 and the first liquid-absorption cores 5 have a porous and loose capillary liquid-absorption structure, and through the effects of capillary force of the second liquid-absorption cores 19 and the first liquid-absorption cores 5, the liquid alkali metal 2 is pumped to the surface of the fuel rods 3. The heat generated by the nuclear fuel fission of the fuel rods 3 causes the liquid alkali metal 2 pumped to the surface of the fuel rods 3 to be vaporized into alkali metal vapor. The alkali metal vapor enters the high-pressure vapor chamber 6 along the direction shown by the dotted arrow in FIG. 1, enters the alkali metal thermoelectric converter 7 along the direction shown by the dotted arrow in FIG. 1 for power generation, and then enters the low-pressure vapor chamber 8, where the alkali metal vapor condenses into a liquid state, and flows to the bottom of the reactor vessel 1 to converge the liquid alkali metal 2 at the bottom of the reactor vessel 1. At the same time, the liquid alkali metal 2 at the bottom of the reactor vessel 1 is pumped to the surface of the fuel rods 3 through the effects of capillary force of the second liquid-absorption cores 19 and the first liquid-absorption cores 5, so as to complete the alkali metal flow cycle.

Since the liquid alkali metal 2 enters the high-pressure vapor chamber 6 after being heating and vaporizing, the pressure in the high-pressure vapor chamber 6 is greater than the pressure in the low-pressure vapor chamber 8. It should be noted that the high pressure in the high-pressure vapor chamber 6 and the low-pressure in the low-pressure vapor chamber 8 are defined with respect to each other, and the pressure in the high-pressure vapor chamber 6 is higher than the pressure in the low-pressure vapor chamber 8.

The alkali metal reactor power supply of the present application adopts alkali metal as the coolant of the reactor, utilizes the vaporization of the alkali metal at low pressure to take away the heat of the reactor core, utilizes the effects of capillary force of the second liquid-absorption cores 19 and the first liquid-absorption cores 5 to provide the driving force for the flow of the liquid alkali metal 2, and utilizes the alkali metal thermoelectric converter 7 to directly convert the heat of the reactor core into electric power.

As shown in FIG. 1, a condenser 9 is arranged in the low-pressure vapor chamber 8, and the number of the condensers 9 may be one or more. The condenser 9 is beneficial to accelerate the condensation of the alkali metal vapor into a liquid state.

As shown in FIG. 2, a control rod 10 is arranged in the middle of the reactor core 4 for controlling the reactor. The control rod 10 is made of a neutron-absorption material and is used for emergency shutdown of the reactor. In case of an accident, the control rod 10 is inserted into the center of the reactor core 4 to absorb neutrons in the core and shut down the reactor.

As shown in FIG. 2, the radial reflective layer 11 is used to reduce the neutron leakage of the reactor core 4, and several control drums 12 are arranged in the radial reflective layer 11 for power controlling of the reactor. The control drum 12 is made of a neutron-absorption material and a neutron-reflection material, wherein the neutron-absorption material of the control drum 12 is shown by blackened parts of the control drum 12 in FIG. 2, and the neutron-reflection material of the control drum 12 is shown by unpainted parts of the control drum 12 in FIG. 2. The control drum 12 is mainly used for power controlling or shutdown of the reactor. When the side of the neutron-absorption material (the blackened parts) of the control drum 12 faces the center of the core, it can absorb neutrons in the core and shut down the reactor; and when the side of the neutron-reflection material (the unpainted parts) of the control drum 12 faces the center of the core, it can reduce the neutrons leakage in the core, thereby realizing the power controlling of the reactor.

Figure 3:
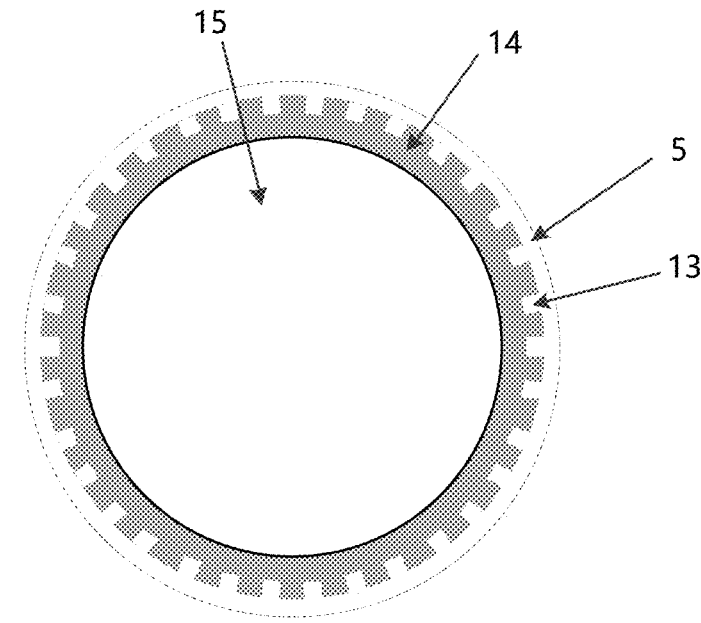
FIG. 3 is a schematic diagram of a radial structure of a fuel rod.

FIG. 3 is a schematic diagram of a radial structure of the fuel rod 3.

As shown in FIG. 3, the fuel rod 3 includes a fuel pellet 15 and a cladding 14 covering the fuel pellet 15. The first liquid-absorption core 5 is arranged on the outer surface of the cladding 14, and the outer surface of the cladding 14 is provided with grooves 13 as a flow path for the liquid alkali metal 2. The fuel pellet 15 is made of nuclear fuel, and the nuclear fuel of the fuel pellet 15 generates heat by fission. The cladding 14 is used to cover the fuel pellet 15 to prevent leakage of radioactive substances in the nuclear fuel. The heat generated by the fuel rods 3 makes the liquid alkali metal 2 to be vaporized continuously, and at the same time, the second liquid-absorption cores 19 and the first liquid-absorption cores 5 continuously absorb the liquid alkali metal 2 for replenishment.

Figure 4:
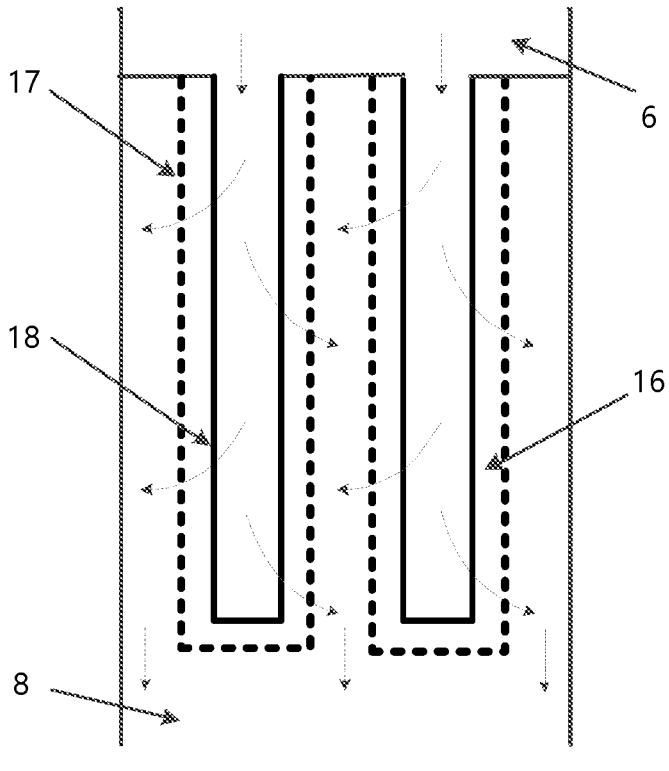
FIG. 4 is a local schematic diagram of the alkali metal thermoelectric converter in FIG. 1.
Figure 5:
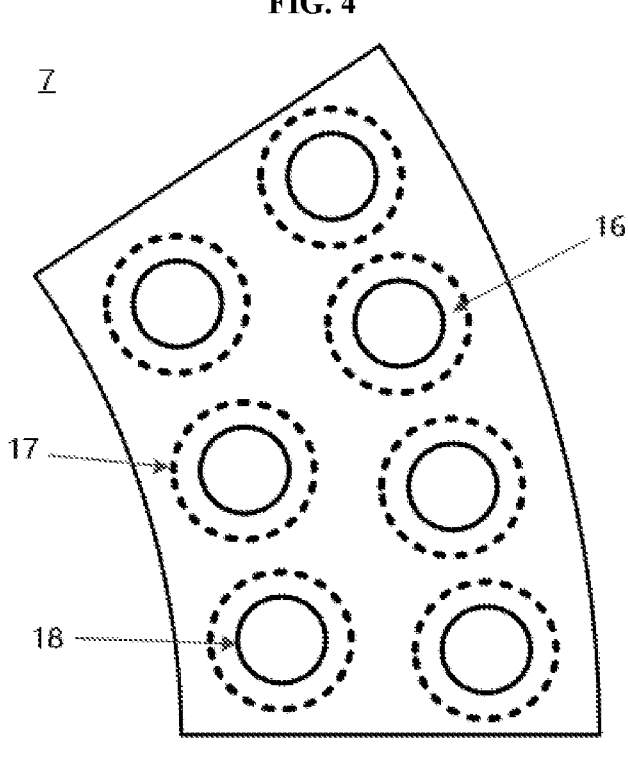
FIG. 5 is a local schematic top diagram of the alkali metal thermoelectric converter in FIG. 1.

FIG. 4 is a local schematic diagram of the alkali metal thermoelectric converter 7 in FIG. 1, and FIG. 5 is a local top diagram of the alkali metal thermoelectric converter 7 in FIG. 1.

As shown in FIG. 4 and FIG. 5, the alkali metal thermoelectric converter 7 includes an anode 18, a cathode 17, and a BASE (Beta Aluminum Solid Electrolyte) tube 16 arranged between the anode 18 and the cathode 17. Driven by a pressure difference between the upper and lower sides of the alkali metal thermoelectric converter 7, the alkali metal vapor in the high-pressure vapor chamber 6 passes through the anode 18, the BASE tube 16 and the cathode 17 in the direction shown by the dotted arrow in FIG. 4 and enters the low-pressure vapor chamber 8. In this way, a potential difference is generated between the anode 18 and the cathode 17 to realize electrical energy conversion. The alkali metal thermoelectric converter 7 includes a plurality of independent thermoelectric heat exchange elements, and each thermoelectric heat exchange element includes the anode 18, the cathode 17, and the BASE tube 16 arranged between the anode 18 and the cathode 17.

In the alkali metal reactor power supply of the present application, phase-change heat transferring is performed with the alkali metal, and the circulating power of the liquid alkali metal is provided by using the capillary liquid-absorption cores without using pumps, valves and other components in traditional reactor systems, thus greatly improving the reliability. The present application has a simplified system and a simple structure, wherein the reactor and thermoelectric converter are integrated, and the same working medium and the same circulating system are used to directly generate electricity. The alkali metal reactor power supply device of the present application has the characteristics of small size, light weight, flexible arrangement, high power generation efficiency, etc., and can be transported, installed and deployed as a whole.

While the present application has been described with reference to a preferred embodiment, various modifications may be made and equivalents may be substituted for elements thereof without departing from the scope of the present application. In particular, as long as there is no structural conflict, the technical features mentioned in the various embodiments can be combined in any manner. The present application is not limited to the specific embodiments disclosed herein, but includes all technical solutions falling within the scope of the claims.

What is claimed is:

1. A nuclear reactor comprising a reactor vessel containing a reactor core and an alkali metal thermoelectric converter, wherein the reactor vessel has a bottom portion, the bottom portion containing liquid alkali metal;

wherein the reactor core is arranged in the reactor vessel, wherein the reactor core comprises a plurality of fuel rods, and a radial reflective layer arranged at periphery of the plurality of fuel rods, wherein a surface of each fuel rod of the plurality of fuel rods is provided with first liquid-absorption cores, and bottom of the reactor core is provided with second liquid-absorption cores arranged to cover the bottom of the reactor core, to connect to the first liquid-absorption cores, and to contact with the liquid alkali metal;

wherein the alkali metal thermoelectric converter is arranged along a circumferential direction of the radial reflective layer, between the outside of the radial reflective layer and an inner wall of the re actor vessel, and which divides the inside of the reactor vessel into a high-pressure vapor chamber located above the alkali metal thermoelectric converter and a low-pressure vapor chamber located below the alkali metal thermoelectric converter; and wherein the alkali metal thermoelectric converter is configured to directly convert heat into electric power;

wherein the first and second liquid-absorption cores are together configured to pump liquid alkali metal from the bottom portion of the reactor vessel to an upper portion of an outer surface of the plurality of fuel rods where the liquid alkali metal is vaporized into alkali metal vapor;

wherein the alkali metal thermoelectric converter is configured to receive alkali metal vapor from the high-pressure vapor chamber for use in electric power generation; and wherein the alkali metal thermoelectric converter is configured to release alkali metal vapor into the low-pressure vapor chamber where the alkali metal vapor can condense into a liquid state.

2. The nuclear reactor according to claim 1, wherein a condenser is arranged in the low-pressure vapor chamber.

3. The nuclear reactor according to claim 1, wherein the alkali metal thermoelectric converter comprises an anode, a cathode, and a BASE tube arranged between the anode and the cathode, and alkali metal vapor in the high-pressure vapor chamber passes through the anode, the BASE tube and the cathode in sequence, so as to generate a potential difference between the anode and the cathode.

4. The nuclear reactor according to claim 1, wherein an interior of the reactor vessel is configured to be in a negative pressure state before the nuclear reactor is activated.

5. The nuclear reactor according to claim 1, wherein the fuel rod comprises a fuel pellet and a cladding covering the fuel pellet, and the first liquid-absorption cores are arranged on an outer surface of the cladding, grooves being provided on the outer surface of the cladding.

6. The nuclear reactor according to claim 1, wherein a control rod is arranged inside of the reactor core for controlling the reactor.

7. The nuclear reactor according to claim 1, wherein several control drums are arranged in the radial reflective layer for controlling a reactor power.

\* \* \* \* \*